(12) United States Patent
Matsuda et al.

(10) Patent No.: US 8,345,133 B2
(45) Date of Patent: Jan. 1, 2013

(54) PHOTOELECTRIC CONVERSION APPARATUS AND IMAGING SYSTEM USING THE SAME

(75) Inventors: Takashi Matsuda, Yokohama (JP); Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 336 days.

(21) Appl. No.: 12/712,393

(22) Filed: Feb. 25, 2010

(65) Prior Publication Data

US 2010/0225793 A1  Sep. 9, 2010

(30) Foreign Application Priority Data

Mar. 9, 2009  (JP) ................. 2009-055209
Mar. 9, 2009  (JP) ................. 2009-055210
Feb. 10, 2010  (JP) ................. 2010-027917

(51) Int. Cl.
*H04N 5/335* (2011.01)
(52) U.S. Cl. ...................... 348/294; 348/280
(58) Field of Classification Search .......... 348/308, 348/280, 294, 270, 266; 250/208.1; 257/184
See application file for complete search history.

(56) References Cited

U.S. PATENT DOCUMENTS

| 7,294,818 | B2 | 11/2007 | Matsuda et al. | ........... 250/208.1 |
| 7,576,371 | B1* | 8/2009 | Goushcha | ................ 257/184 |
| 2003/0209712 | A1 | 11/2003 | Fujita et al. | .................. 257/72 |
| 2011/0068253 | A1* | 3/2011 | Arishima et al. | .......... 250/208.1 |
| 2011/0134270 | A1* | 6/2011 | Arishima et al. | ............. 348/294 |

FOREIGN PATENT DOCUMENTS

JP  2003-258232 A  9/2003

* cited by examiner

*Primary Examiner* — Aung S Moe
(74) *Attorney, Agent, or Firm* — Fitzpatrick, Cella, Harper & Scinto

(57) ABSTRACT

A plurality of photoelectric conversion elements including a first photoelectric conversion element, a second photoelectric conversion element, and a third photoelectric conversion element, are arranged in a photoelectric conversion apparatus of the present invention. Provided, between the first photoelectric conversion element and the second photoelectric conversion element, is a first semiconductor region of a first conductivity type and of a first width in which a signal charge is a minor charier. And, provided, between the first photoelectric conversion element and the third photoelectric conversion element, is a second semiconductor region of the first conductivity type in a higher impurity concentration and of a second width narrower than the first width at a position deeper in a semiconductor substrate rather than a depth of the first semiconductor region.

19 Claims, 12 Drawing Sheets

PHOTOELECTRIC CONVERSION APPARATUS AND IMAGING SYSTEM USING THE SAME

BACKGROUND OF THE INVENTION

1. Field of the Invention

The present invention relates to an isolation structure of a photoelectric conversion apparatus.

2. Description of the Related Art

Many digital still cameras and digital camcorders use CCD-type or CMOS-type photoelectric conversion apparatuses. In recent years, the pixels of photoelectric conversion apparatuses are being reduced in size, and measures to deal with mixing (cross talk) charges between adjacent pixels that occurs as a result are being studied.

Japanese Patent Application Laid-Open No. 2003-258232 discusses a construction in which a p-type well region that acts as a barrier for element isolation for preventing mixing (cross talk) charges between adjacent pixels is formed in a deep region in combination with an n-type well region of a photoelectric conversion element.

However, even with the p-type well region discussed in Japanese Patent Application Laid-Open No. 2003-258232, there are cases in which it is difficult to adequately suppress the leakage of charges. Further, generally, with photoelectric conversion apparatuses, a transistor for reading out a charge of a photoelectric conversion element is provided at the periphery of the photoelectric conversion element, and it is not necessarily the case that photoelectric conversion elements are disposed at equal distances from each other. The present inventors discovered that in some cases the leakage amounts of charges from p-type well regions can serve as element isolation regions of photoelectric conversion elements disclosed in Japanese Patent Application Laid-Open No. 2003-258232 differ depending on the spaces between the photoelectric conversion elements. When the leakage amounts of signal charges to adjacent photoelectric conversion elements vary in this manner, the image quality decreases and correction of image signals is difficult.

SUMMARY OF THE INVENTION

According to an aspect of the present invention, a photoelectric conversion apparatus comprises: a semiconductor substrate; a plurality of photoelectric conversion elements arranged on the semiconductor substrate, and including a first photoelectric conversion element, a second photoelectric conversion element adjacent to the first photoelectric conversion element, and a third photoelectric conversion element adjacent to the first photoelectric conversion element; a transistor arranged on the semiconductor substrate, for transferring a signal charge generated in the photoelectric conversion element; a first semiconductor region of a first conductivity type, such that the signal charge is a minor carrier, arranged between the first photoelectric conversion element and the second photoelectric conversion element, wherein the first semiconductor region has a first width; and a second semiconductor region of the first conductivity type is arranged between the first photoelectric conversion element and the third photoelectric conversion element, wherein the second semiconductor region has a second width smaller than the first width, and wherein the second semiconductor region extends into the semiconductor substrate deeper rather than the first semiconductor region.

Further, according to the other aspect of the present invention, a photoelectric conversion apparatus comprises: a semiconductor substrate; a plurality of photoelectric conversion elements arranged on a main surface of the semiconductor substrate, and including a first photoelectric conversion element, a second photoelectric conversion element arranged in adjacent to the first photoelectric conversion element, and a third photoelectric conversion element arranged in adjacent to the first photoelectric conversion element; a transistor arranged on the semiconductor substrate, for transferring a signal charge generated in the photoelectric conversion element; a first semiconductor region of a first conductivity type, such that the signal charge is a minor carrier, arranged between the first photoelectric conversion element and the second photoelectric conversion element, wherein the first semiconductor region has a first width; and a second semiconductor region of the first conductivity type is arranged between the first photoelectric conversion element and the third photoelectric conversion element, wherein the second semiconductor region has a second width smaller than the first width, and wherein the second semiconductor region has an impurity concentration higher than that of the first semiconductor region.

The other features and advantages of the present invention will be apparent from the following description taken in conjunction with the accompanying drawings, in which like reference characters designate the same or similar parts throughout the figures thereof.

Further features of the present invention will become apparent from the following description of exemplary embodiments with reference to the attached drawings.

Figure 1A:
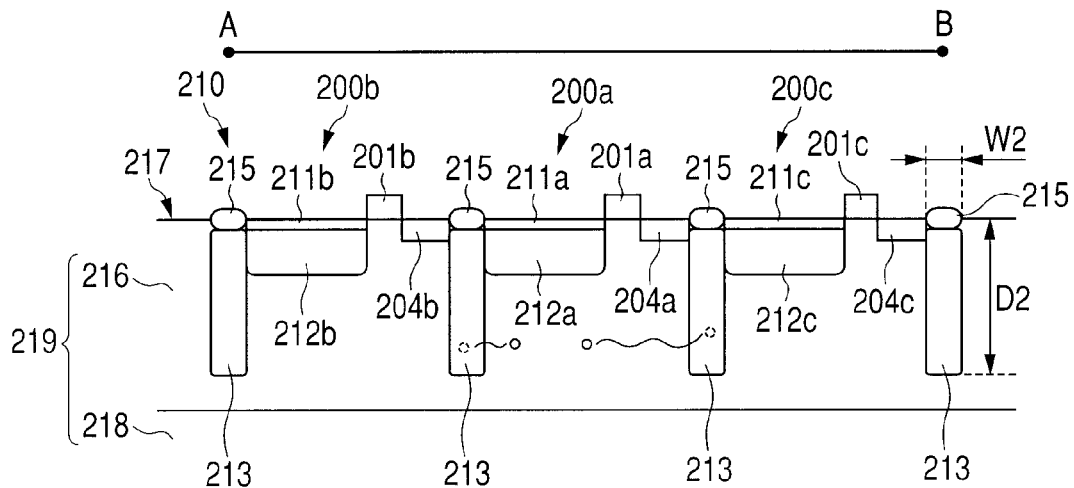
FIG. 1A and FIG. 1B are cross-sectional schematic views of a photoelectric conversion apparatus that describe a first embodiment.

The accompanying drawings, which are incorporated in and constitute a part of the specification, illustrate embodiments of the invention and, together with the description, serve to explain the principles of the invention.

DESCRIPTION OF THE EMBODIMENTS

Preferred embodiments of the present invention will now be described in detail in accordance with the accompanying drawings.

A photoelectric conversion apparatus of the present invention has a plurality of photoelectric conversion elements including a first photoelectric conversion element, a second photoelectric conversion element, and a third photoelectric conversion element, wherein an interval between an active region in which the first photoelectric conversion element is arranged and an active region in which the second photoelectric conversion element is arranged is in a first distance. And an interval between the active region in which the first photoelectric conversion element and an active region in which the third photoelectric conversion element is a second distance that is smaller than the first distance. More specifically, a first semiconductor region of a first conductivity type that has a first width is disposed between the first photoelectric conversion element and the second photoelectric conversion element. Further, a second semiconductor region of the first conductivity type that has a second width is disposed between the first photoelectric conversion element and the third photoelectric conversion element. In this case, the second semiconductor region extends deeper into the semiconductor substrate than the first semiconductor region. Alternatively, the second semiconductor region has an impurity concentration that is higher than that of the first semiconductor region. Wherein, the first conductivity type is a conductivity type of a semiconductor in which the signal charge is a miner carrier. According to this construction, it is possible to reduce a difference between a potential barrier formed by the first semiconductor region that has the first width and a potential barrier formed by the second semiconductor region that has the second width. Furthermore, a construction can also be adopted such that the difference is eliminated. Hence, it is possible to suppress the occurrence of cases in which a signal charge generated at a certain photoelectric conversion element mixes non-uniformly with a charge of any photoelectric conversion element among a plurality of adjacent photoelectric conversion elements. That is, it is possible to reduce a variation of the amounts of signal charges leaked and mixing with charges of a plurality of adjacent photoelectric conversion elements, and thereby improve the obtained image quality. Further, when performing correction, since it is possible to easily correct an image signal, the configuration of a required image processing unit can also be simplified. Hereunder, the present embodiments are described in detail using the drawings.

(Pixel Circuit Example)

Figure 2A:
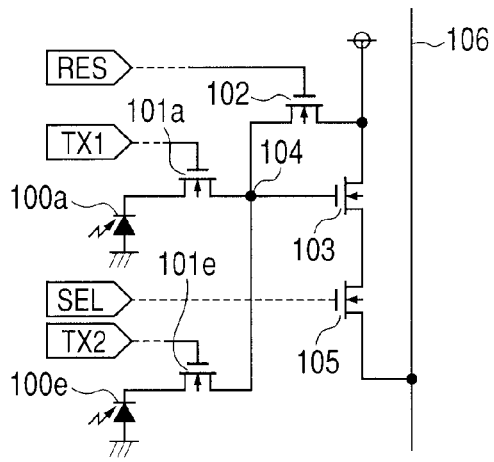
FIG. 2A is a circuit diagram of the photoelectric conversion apparatus that describes the first embodiment.
Figure 2B:
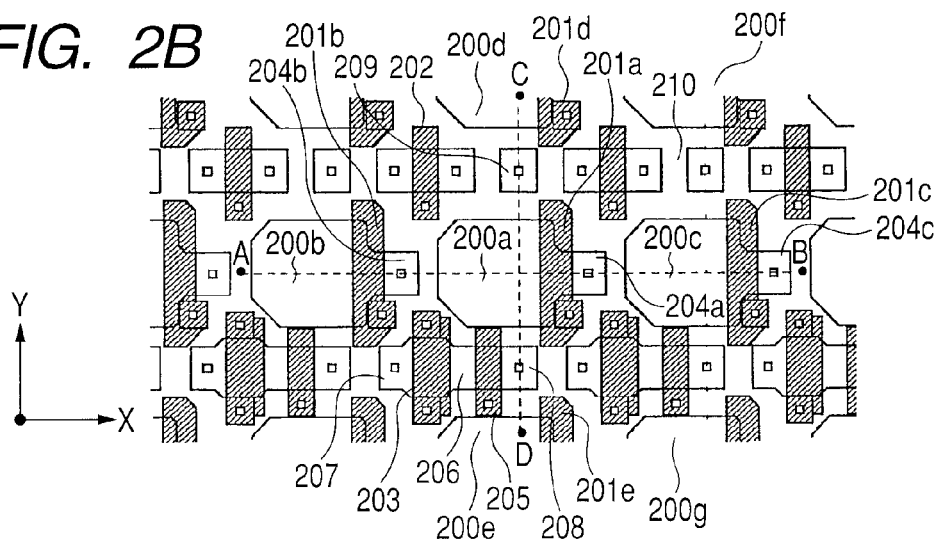
FIG. 2B is a planar layout view of the photoelectric conversion apparatus that describes the first embodiment.
Figure 2C:
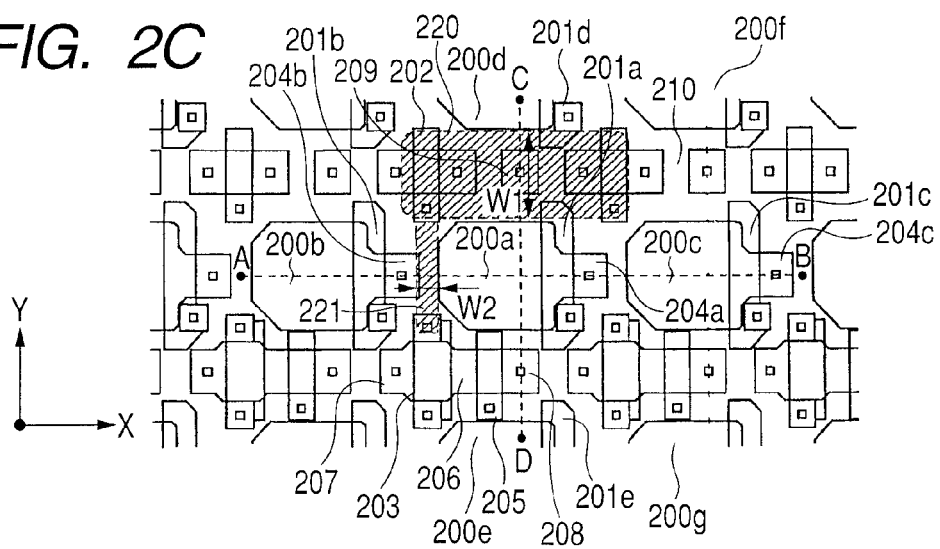
FIG. 2C is a planar layout view that supplements the view shown in FIG. 2B.

FIG. 2A illustrates an example of a pixel circuit to which the present invention can be applied. FIG. 2B illustrates a planar layout of the pixel circuit. FIG. 2C illustrates a planar layout that supplements the description of FIG. 2B. FIG. 2A illustrates a pixel cell that includes two photoelectric conversion elements. In the photoelectric conversion apparatus, this kind of pixel cell is arrayed one dimensionally or two dimensionally to form an imaging region. When a pixel is taken as a smallest repeating unit that includes one photoelectric conversion element, it can be said that the pixel cell shown in FIG. 2A includes two pixels.

First, a pixel cell is described below using FIG. 2A. The example shown in FIG. 2A includes a photodiode 100 that is a photoelectric conversion element, a transfer MOS transistor 101, a reset MOS transistor 102, an amplifier MOS transistor 103, a selection MOS transistor 105, and an output line 106. 104 denotes a node of an intersection connected to a gate electrode of the amplifier MOS transistor 103, the transfer MOS transistor 101 and the reset MOS transistor 102. The intersection includes a floating diffusion region. The note is referred as a floating diffusion region in a following description. The present example of the pixel cell includes two photoelectric conversion elements 100a and 100e, and has two transfer MOS transistors 101a and 101e. The transfer MOS transistor 101a transfers a charge that is generated at the photoelectric conversion element 100a to the floating diffusion region 104. The transfer MOS transistor 101e transfers a charge that is generated at the photoelectric conversion element 100e to the floating diffusion region 104. The amplifier MOS transistor 103 outputs an output in accordance with a potential of the floating diffusion region 104 to the output line 106 via the selection MOS transistor 105. The amplifier MOS transistor 103 is one part of a source-follower circuit, and a gate electrode thereof is connected to the floating diffusion region 104. The reset MOS transistor 102 resets a node of the gate electrode of the amplifier MOS transistor 103, that is, resets the floating diffusion region 104 to a specific potential (reset potential). A transfer control signal TX1 is supplied to the transfer MOS transistor 101a, and a transfer control signal TX2 is supplied to the transfer MOS transistor 101e. A reset control signal RES is supplied to the reset MOS transistor, and a selection control signal SEL is supplied to the selection MOS transistor 105. Reading of signal charges is controlled by the respective control signals. According to the present embodiment, two photoelectric conversion elements share the single amplifier MOS transistor 103, the single reset MOS transistor 102, and the single selection MOS transistor 105.

A planar layout of the photoelectric conversion apparatus is illustrated using FIG. 2B. The layout illustrated in FIG. 2B includes a photodiode 200 that is a photoelectric conversion element, a gate electrode 201 of a transfer MOS transistor, and a gate electrode 202 of a reset MOS transistor. The layout illustrated in FIG. 2B also includes a gate electrode 203 of an amplifier MOS transistor, a floating diffusion region 204, and a gate electrode 205 of a selection MOS transistor. Furthermore, the layout includes a source region 206 of an amplifier MOS transistor, and a drain region 207 of an amplifier MOS transistor. A source region 208 of a selection MOS transistor is connected to the output line 106. A semiconductor region 209 is used to supply a voltage to a semiconductor region or a semiconductor substrate, and is sometimes referred to as a "well contact". An element isolation region 210 defines an active region of each element. An element isolation structure including an insulator such as a LOCOS or an STI is provided in the element isolation region 210. A semiconductor region that serves as a potential barrier against a signal charge may also be arranged in the element isolation region 210. Further, it is assumed that the element isolation region 210 may be a region that does not have an element isolation structure and in which only a semiconductor region that serves as a potential barrier against a signal charge is arranged. In this case, when the element isolation region 210 includes only a semiconductor region that serves as a potential barrier against a signal charge, it is assumed that an active region is defined by a boundary with the semiconductor region that serves as the potential barrier with respect to a signal charge. The element isolation region 210 has a first element isolation region 220 and a second element isolation region 221.

The element isolation region 210 is described below using FIG. 2C. FIG. 2C is a simplified planar layout for further describing the construction illustrated in FIG. 2B. In FIG. 2C, the first element isolation region 220 is arranged between a photoelectric conversion element 200a and a photoelectric conversion element 200d or 200e. The second element isolation region 221 is arranged between the photoelectric conversion element 200a and a photoelectric conversion element 200b or 200c. In this case, the first element isolation region 220 has a first width W1 and the second element isolation region 221 has a second width W2, where W1>W2. The first width W1 is a width along a line segment that connects the center of gravity of the photoelectric conversion element 200a and the center of gravity of the photoelectric conversion element 200d or 200e. The second width W2 is the width along a line segment that connects the center of gravity of the photoelectric conversion element 200a and the center of gravity of the photoelectric conversion element 200b or 200c. The first element isolation region 220 and the second element isolation region 221 are disposed in a grid shape to enclose the photoelectric conversion element. Wherein, the first width W1 is a length between the photoelectric conversion elements 200a and 200e, and a distance between an active region in which the photoelectric conversion elements 200a is arranged and an active region in which the photoelectric conversion elements 200e is arranged. And, the second width W2 is a length between the photoelectric conversion elements 200a and 200b, and a distance between the active region in which the photoelectric conversion elements 200a is arranged and an active region in which the photoelectric conversion elements 200b is arranged. The first element isolation region 220 and the second element isolation region 221 shown in FIG. 2C are arranged in the example shown in FIG. 2B. The floating diffusion region 204 is also arranged in the active region that includes the photoelectric conversion element 200 defined by the element isolation region.

To facilitate description, the plurality of photoelectric conversion elements 200 that are two-dimensionally arranged in FIG. 2B are taken to be photoelectric conversion elements 200a, 200b, 200c, 200d, and 200e, respectively. The gate electrode and the floating diffusion region of a transfer MOS transistor corresponding to the photoelectric conversion element 200a are denoted by reference numerals 201a and 204a, respectively. Similarly, the gate electrodes and the floating diffusion regions of transfer MOS transistors of the other photoelectric conversion elements 200b, 200c, 200d, and 200e are denoted by reference numerals 201b, 201c, 201d, and 201e and reference numerals 204b, 204c, 204d, and 204e, respectively.

The photoelectric conversion apparatus is not limited to the circuit shown in FIG. 2A, and may be a construction in which an even larger number of photoelectric conversion elements share an amplifier MOS transistor, or a construction that does not have a selection MOS transistor. Further, a pixel cell of the photoelectric conversion apparatus may have only one photoelectric conversion element. And The photoelectric conversion apparatus is not limited to the planar layout shown in FIG. 2B. Hereunder, embodiments of the present invention are described referring to the drawings.

First Embodiment

Figure 1B:
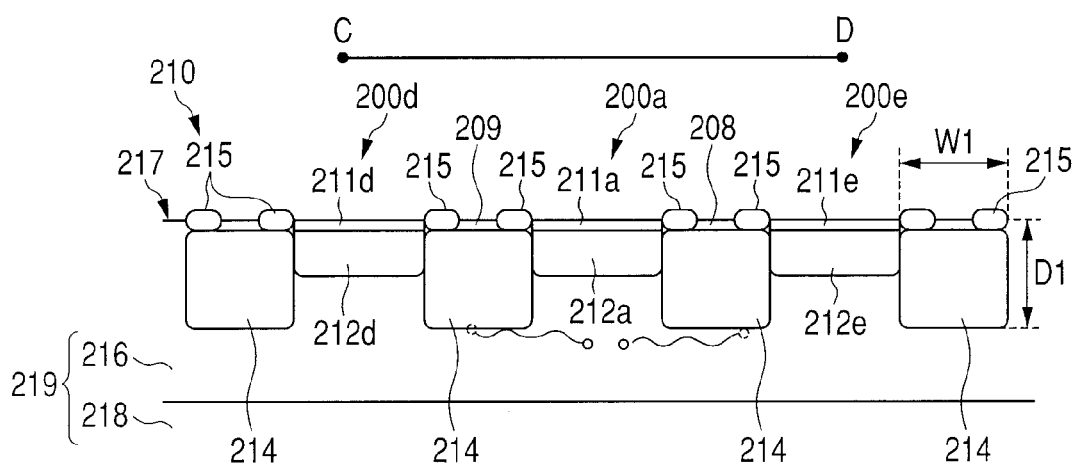

The photoelectric conversion apparatus of the present embodiment is described below using FIGS. 1A and 1B. According to the present embodiment, as a method of making potential barriers equal, the depths of semiconductor regions that form potential barriers are changed. FIG. 1A is a cross-sectional schematic view along a line AB (first direction X) in FIG. 2B. FIG. 1B is a cross-sectional schematic view along a line CD (second direction Y) in FIG. 2B. In FIG. 1A and FIG. 1B, the same components as those in FIG. 2B are denoted by the same reference numerals, and a description thereof is omitted below. The present embodiment describes a case in which a signal charge is an electron. According to the present embodiment, it is assumed that photoelectric conversion elements, that is, pixels, are arranged in a matrix shape along a first direction X as shown by the line AB and a second direction Y as shown by the line CD, and that the first direction X and the second direction Y are perpendicular.

The construction illustrated in FIGS. 1A and 1B includes a semiconductor region 216, a source material or base material 218 of a semiconductor substrate, and a semiconductor substrate 219. The semiconductor region 216 is formed in the semiconductor substrate or on the semiconductor substrate. For example, when forming the semiconductor region 216 by ion implantation in the semiconductor substrate, the semiconductor region 216 is formed by providing an epitaxial layer on the semiconductor substrate. According to FIGS. 1A and 1B, a portion in which the semiconductor substrate remains as it is in its original state is taken as the source material or base material 218, and the semiconductor substrate 219 is taken to include the source material or base material 218 and the semiconductor region 216. According to the present embodiment, the semiconductor region 216 is taken to be a p-type semiconductor region, and the source material or base material 218 is taken to be n-type. The semiconductor region 216 may also be the source material or base material 218 itself. Further, the conductivity type of the semiconductor region 216 or the source material or base material 218 may be n-type or p-type. A main surface 217 of the semiconductor substrate 219 includes a light-receiving surface of a photoelectric conversion element. And, above the main surface 217, a gate insulating film is arranged (not depicted in the drawings). The photoelectric conversion element 200 includes at least a p-type semiconductor region 211 that can function as a surface protection layer and an n-type semiconductor region 212 that can function as a charge accumulation unit. The floating diffusion region 204 is formed by an n-type semiconductor region. Hereunder, to facilitate description, a p-type semiconductor region 211a and an n-type semiconductor region 212a are assumed to correspond to the photoelectric conversion element 200a. The same applies with respect to the other photoelectric conversion elements 200b, 200c, 200d and 200e. The p-type semiconductor regions are taken as the regions denoted by reference numerals 211b, 211c, 211d, and 211e, respectively, and the n-type semiconductor regions are taken as the regions denoted by reference numerals 212b, 212c, 212d, and 212e, respectively.

In the photoelectric conversion apparatus described above, Element isolation structures (in this case, LOCOS) 215 are arranged on a main surface of the semiconductor substrate of the element isolation region 210 having a first element isolation region 220 having a first width W1 and a second element isolation region 221 having a second width W2. Below the element isolation structures 215 are arranged p-type semiconductor regions 213 and 214 that can act as potential barriers against a signal charge, and that have a higher impurity concentration compared to the p-type semiconductor region 216. The p-type semiconductor region 214 that has a width W1 and a depth D1 is arranged in the first isolation region of a width W1 between the photoelectric conversion element 200a and the photoelectric conversion element 200e. The p-type semiconductor region 213 that has a width W2 and a depth D2 that is deeper than the depth D1 is arranged in the second isolation region of a width W2 between the photoelectric conversion element 200a and the photoelectric conversion element 200c. The impurity concentrations of the p-type semiconductor regions 213 and 214 are constant. By having p-type semiconductor regions with these width and depth relations, a variation between potential barriers is reduced. And, thereby, it is possible to reduce a variation between the amounts of charges generated at the photoelectric conversion elements 200 leaked and into the charge generated in adjacent photoelectric conversion elements.

The p-type semiconductor regions 213 and 214 are formed by the following method. After forming an element isolation structure on a semiconductor substrate, first, a first mask such as a photoresist that has an opening in a region in which the p-type semiconductor region 214 is to be formed on the semiconductor substrate is provided, and the p-type semiconductor region 214 is formed by performing ion implantation with a first energy. Thereafter, a second mask such as a photoresist that has an opening in a region in which the p-type semiconductor region 213 is to be formed on the semiconductor substrate is provided, and the p-type semiconductor region 213 is formed by performing ion implantation with a second energy. At that time, in the ion implantation with the first energy and in the ion implantation with the second energy, the same predetermined dosage of the ion is implanted. Thus, p-type semiconductor regions that have different widths and depths can be formed by separate processes. The order of forming the p-type semiconductor regions 213 and 214 is arbitrary.

Figure 3A:
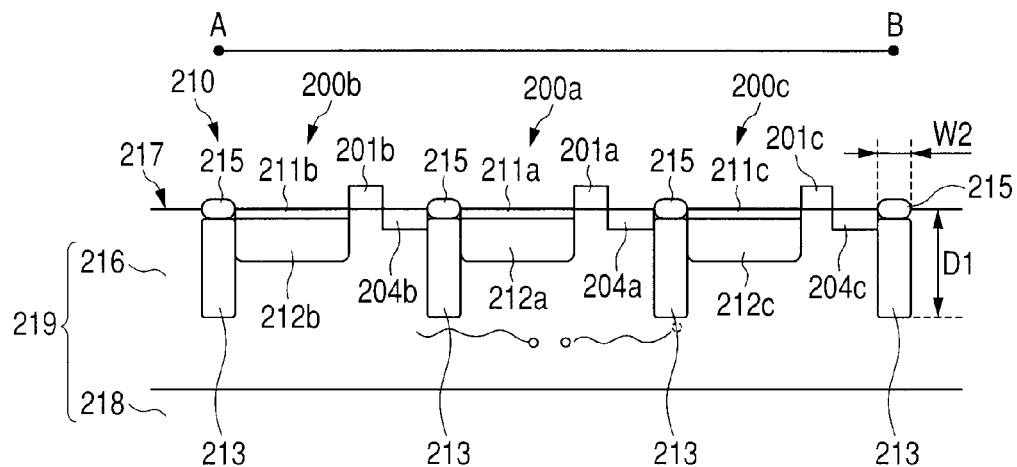
FIG. 3A and FIG. 3B are cross-sectional schematic views of a photoelectric conversion apparatus for comparison that describe the first embodiment.
Figure 3B:
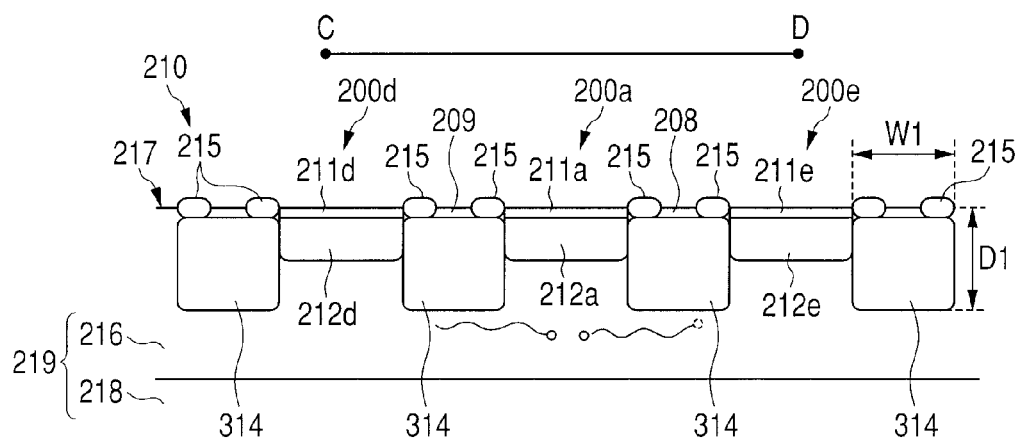

Next, the tasks of the present invention are described using FIG. 1A to FIG. 3B. FIGS. 3A and 3B are cross-sectional schematic views of a photoelectric conversion apparatus that corresponds to FIGS. 1A and 1B. Components in FIGS. 3A and 3B that correspond to components shown in FIGS. 1A, 1B or FIGS. 2A to 2C are denoted by the same reference numbers, and a description of those components is omitted below. In the planar layout shown in FIG. 2B, the intervals between active regions including a photoelectric conversion element are different in some cases. For example, a distance between the first photoelectric conversion element 200a and the second photoelectric conversion element 200c that is adjacent to the first photoelectric conversion element 200a is different from a distance between the first photoelectric conversion element 200a and the third photoelectric conversion element 200e that is adjacent to the first photoelectric conversion element 200a. Accordingly, there would be substantial variation between signal charge leakages and mixings, such as from one the photoelectric conversion element 200a into the other photoelectric conversion elements 200b, 200c, 200d and 200e. In this case, semiconductor regions (313 and 314) that are arranged in element isolation regions and that act as potential barriers against a signal charge are formed simultaneously on the entire surface of the photoelectric conversion apparatus. Hence, although the depths and impurity concentrations of the semiconductor regions (313, 314) that act as potential barriers against a signal charge are the same for all semiconductor regions, the widths thereof are different (W1 and W2). In this construction, when signal charges are present in the semiconductor region 216 at a semiconductor substrate depth in the photoelectric conversion element 200a, the mixing (cross talk) quantity of the signal charges with respect to the adjacent plurality of photoelectric conversion elements 200b, 200c, 200d, and 200e are different. The reason is that because signal charges move randomly and the probability of the signal charges disappearing is constant, the amount of a signal charge that mixes into an adjacent photoelectric conversion element changes depending on the width of the p-type semiconductor region, i.e. the distance. Hence, it is difficult for a signal charge to mix into the photoelectric conversion element 200e that is at a large distance from the photoelectric conversion element 200a and it is easy for a signal charge to mix into the photoelectric conversion element 200c that is at a short distance from the photoelectric conversion element 200a. On the other hand, in the photoelectric conversion apparatus shown in FIGS. 1A and 1B, when a charge is generated at a semiconductor substrate depth in the photoelectric conversion element 200a, the charge is obstructed by the p-type semiconductor region 213 and it is difficult for the charge to mix into the photoelectric conversion element 200c. Not only in the electric charge generated in deeper in the semiconductor substrate, but also in the electric charge overflowed from the semiconductor regions 313 and 314, similar variation would be caused. Hence, as described in the present embodiment, when the widths of p-type semiconductor regions that can act as potential barriers against a signal charge are different, it is possible to equalize the movement of charges between photoelectric conversion elements by adjusting the depths of the p-type semiconductor regions.

Although according to the present embodiment an active region is defined by the element isolation structure 215, the construction may also be one in which the p-type semiconductor regions 213 and 214 are provided and there is no element isolation structure 215. In that case, an active region is defined by a boundary with the p-type semiconductor region 213 and the p-type semiconductor region 216. The term "boundary with the semiconductor region" refers to a point at which the impurity concentration of the p-type semiconductor region 216 is reached in the impurity concentration profile. In a case where the semiconductor region 216 is an n-type semiconductor region, the term "boundary with the semiconductor region" refers to a point at which the net concentration becomes zero in the impurity concentration profile. Further, the width of the p-type semiconductor region is taken as the length of the p-type semiconductor region on the main surface 217 when the p-type semiconductor region is projected onto the main surface 217 of the semiconductor substrate. The depth of the p-type semiconductor region is taken as the length of the p-type semiconductor region in a direction towards the inside of the semiconductor substrate from the main surface 217 of the semiconductor substrate. In this case, a comparison of the depths of p-type semiconductor regions can also be considered to be a comparison of the distances between the bottom surface of the p-type semiconductor regions and the main surface 217 of the semiconductor substrate.

Figure 6A:
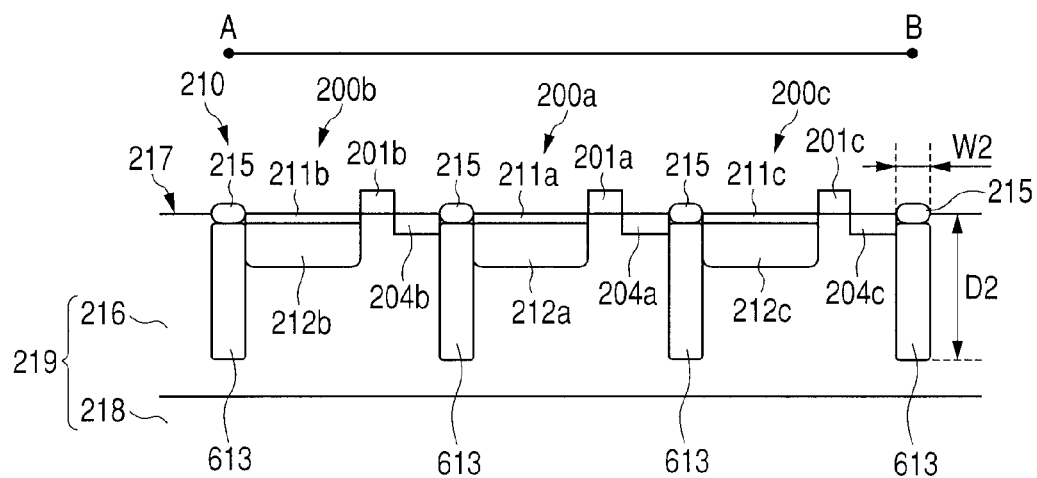
FIG. 6A and FIG. 6B are cross-sectional schematic views of a photoelectric conversion apparatus that describe a modification example of the first embodiment.
Figure 6B:
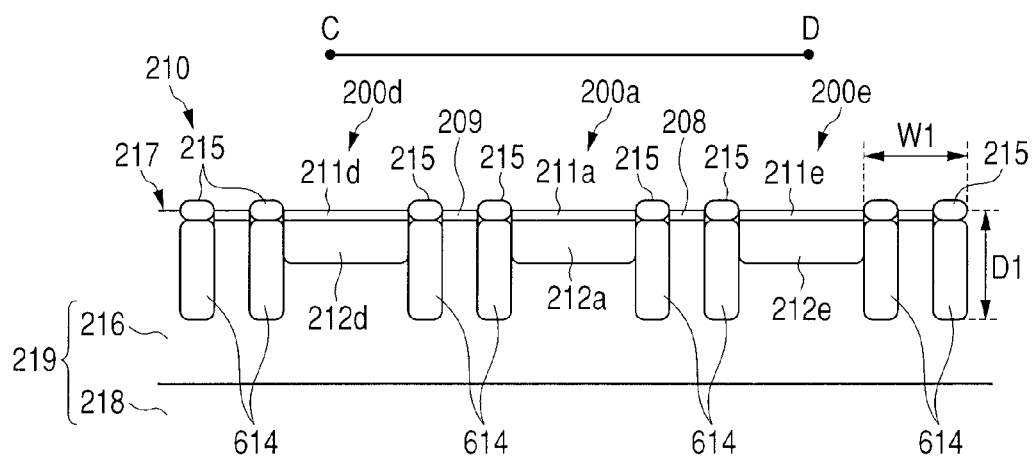

In the present embodiment the p-type semiconductor region 214 of width W1 is provided in a region of width W1 and the p-type semiconductor region 213 of width W2 is provided in a region of width W2. However, in a region of the width W1, the p-type semiconductor region 213 or the like of a width different from the width W1 may be provided. For example, as illustrated in FIGS. 6A and 6B which shows a similar cross-sectional schematic view to FIGS. 1A and 1B, a plurality of p-type semiconductor regions 614 of an arbitrary width that is different to the width W1 may be provided in the region of width W1. Moreover, as shown in FIGS. 1A and 1B, in the element isolation region on the main surface of the semiconductor substrate, the semiconductor regions 208 and 209 constituting the other elements such as transistor may be provided.

Second Embodiment

Figure 4A:
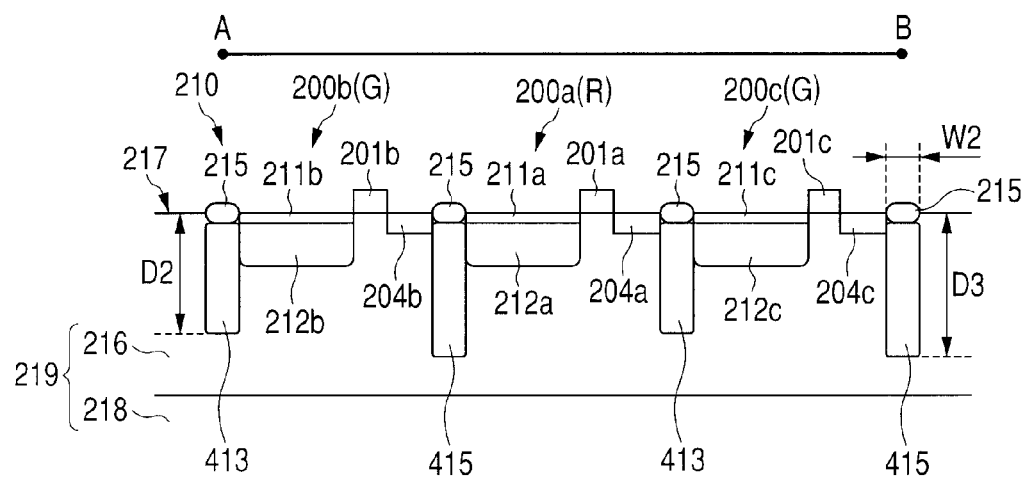
FIG. 4A and FIG. 4B are cross-sectional schematic views of a photoelectric conversion apparatus that describe a second embodiment.
Figure 4B:
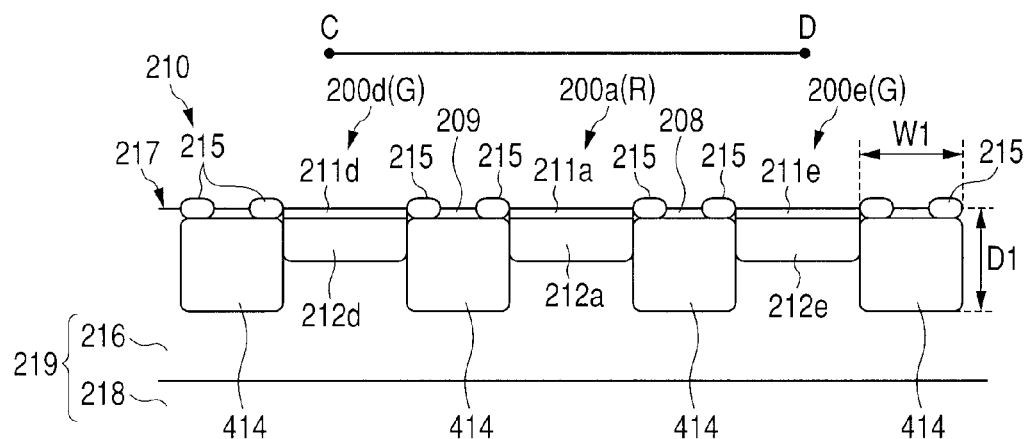

The present embodiment relates to a color photoelectric conversion apparatus. A feature of the present embodiment is that, in addition to the construction of the first embodiment, a depth of a p-type semiconductor region is also adjusted in accordance with a wavelength of incident light. The present embodiment is described specifically below using FIGS. 4A and 4B. FIGS. 4A and 4B are cross-sectional schematic views of a photoelectric conversion apparatus that corresponds to FIGS. 1A and 1B. Components illustrated in FIGS. 4A and 4B that have the same function as in FIGS. 1A and 1B are denoted by the same reference numbers, and a description of those components is omitted below.

The photoelectric conversion apparatus of the present embodiment includes a color filter. FIGS. 4A and 4B illustrate a case in which color filters are arranged according to the Bayer arrangement. For example, a red color filter (R) is provided on the upper part of the photoelectric conversion element 200a, and a green color filter (G) is provided on the upper part of the other photoelectric conversion elements 200b, 200c, 200d, and 200e. Hereunder, these components are denoted by 200a(R), 200b(G) and the like. In this case, light that is incident on the photoelectric conversion element 200a(R) reaches a deep part of the semiconductor substrate because the wavelength is long, and generates a charge at a deep part of the semiconductor substrate. Further, because a wavelength of light incident on the photoelectric conversion element 200b(G) is short in comparison to light incident on the photoelectric conversion element 200a(R), light incident on the photoelectric conversion element 200b(G) generates a charge at a shallow portion of the semiconductor substrate. Thus, according to the present embodiment, as shown in FIG. 4A, a p-type semiconductor region of width W2 includes a p-type semiconductor region 413 of a depth D2 and a p-type semiconductor region 415 of a depth D3 that is deeper than the depth D2. The p-type semiconductor region 415 of the depth D3 is provided close to the photoelectric conversion element 200a(R). The p-type semiconductor region 413 of the depth D2 is provided closer to the photoelectric conversion element 200b(G) than to the photoelectric conversion element 200a(R). The situation regarding the p-type semiconductor region 414 of width W1 is the same as that of the p-type semiconductor region 214 of the first embodiment. According to this construction, even in a case in which wavelengths of incident light are different, it is possible to equalize the amounts of signal charges that mix into adjacent photoelectric conversion elements.

According to the present embodiment, the relation between depths of p-type semiconductor regions that can act as potential barriers against a signal charge is depth D3>depth D2>depth D1. In this case, although the depth of the p-type semiconductor region 413 is taken as the depth D2 that is the same as in the first embodiment, a construction may also be adopted in which the depth of the p-type semiconductor region 415 is the depth D2 and the depth of the p-type semiconductor region 413 is a depth between the depths D2 and D1. Further, with respect to the p-type semiconductor region 414 of width W1 shown in FIG. 4B, the p-type semiconductor region need not only have the depth D1 and, in accordance with a wavelength of incident light, a p-type semiconductor region may be formed that has a deeper depth than the depth D1 or a p-type semiconductor region may be formed that has a depth that is shallower than the depth D2 and deeper than the depth D1. Furthermore, a p-type semiconductor region that can serve as a potential barrier against a signal charge may by configured by a plurality of semiconductor regions as in the modification example (FIGS. 6A and 6B) of the first embodiment.

Third Embodiment

Figure 5A:
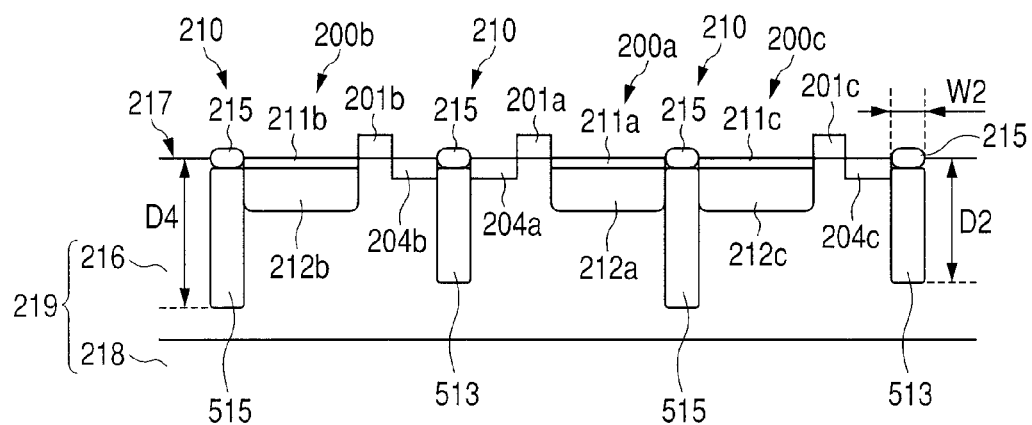
FIG. 5A and FIG. 5B are cross-sectional schematic views of a photoelectric conversion apparatus that describe a third embodiment.
Figure 5B:
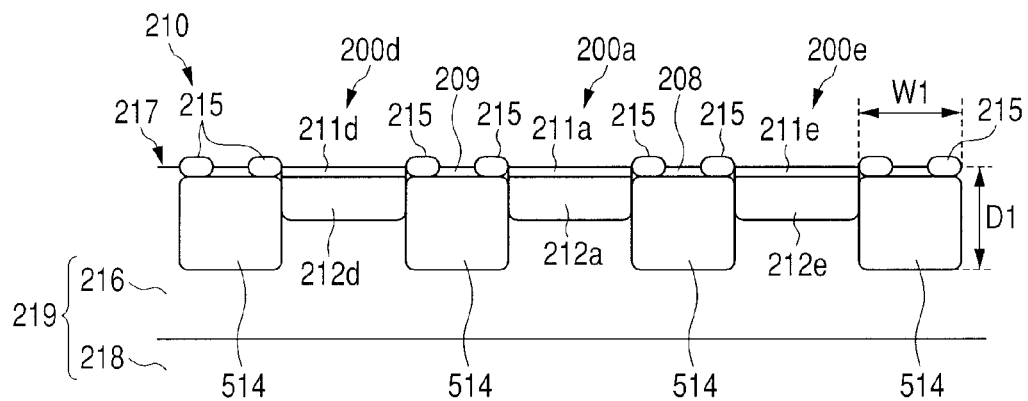

According to the present embodiment, a construction is described in which the layout of photoelectric conversion elements is different from the first embodiment. In the present embodiment, similarly to the first embodiment, depths are changed according to widths of p-type semiconductor regions that can act as potential barriers against a signal charge. However, according to this embodiment the depths of p-type semiconductor regions are adjusted according to the layout of photoelectric conversion elements. The present embodiment is described in detail using FIGS. 5A and 5B. FIGS. 5A and 5B are cross-sectional schematic views of a photoelectric conversion apparatus that is equivalent to that shown in FIGS. 1A and 1B. In FIGS. 5A and 5B, components that have the same functions as in FIGS. 1A and 1B are denoted by the same reference numbers and a description of those components is omitted below.

According to the present embodiment, the arrangement is a so-called mirror arrangement in which photoelectric conversion elements and the like are symmetric with respect to a certain criterion (in this case, the element isolation region 210) in a planar layout (not shown). In a corresponding cross-sectional schematic view shown in FIG. 5A, the photoelectric conversion element 200a and the photoelectric conversion element 200c are arranged so as to face each other in a condition in which the element isolation region 210 is sandwiched therebetween, and the floating diffusion region 204a and the floating diffusion region 204b are arranged so as to face each other in a condition in which the element isolation region 210 is sandwiched therebetween.

In this arrangement also, a p-type semiconductor region of width W2 is formed more deeply than a p-type semiconductor region 514 of width W1. Further, according to this arrangement, a plurality of p-type semiconductor regions of width W2 include a p-type semiconductor region 513 that is at a large distance from the photoelectric conversion element 200a and a p-type semiconductor region 515 that is at a short distance from the photoelectric conversion element 200a. This is because a transfer transistor is arranged in an active region of the photoelectric conversion element. The depths of the p-type semiconductor region 513 and the p-type semiconductor region 515 differ, respectively, according to a distance between a semiconductor region 212 of a first conductivity type of an adjacent photoelectric conversion element and the p-type semiconductor regions 513 and 515. More specifically, in FIG. 5A, the p-type semiconductor region 515 that is at a short distance from the photoelectric conversion element is disposed at a depth D4 that is deeper than the depth D2 of the p-type semiconductor region 513 that is at a large distance from the photoelectric conversion element. In such FIG. 5A, a distance between the photoelectric conversion element 200a and the photoelectric conversion element 200c is shorter than a distance between the photoelectric conversion element 200a and the photoelectric conversion element 200b. Hence, the p-type semiconductor region 515 of the depth D4 is provided between the photoelectric conversion element 200a and the photoelectric conversion element 200c, and the p-type semiconductor region 513 of the depth D2 that is shallower than the depth D4 is provided between the photoelectric conversion element 200a and the photoelectric conversion element 200b. By adjusting the depths of p-type semiconductor regions in this manner, it is possible to make the amount of a charge that mixes into the photoelectric conversion element 200c from the photoelectric conversion element 200a and the amount of a charge that mixes into the photoelectric conversion element 200b from the photoelectric conversion element 200a close to equal. In this connection, the distance between the photoelectric conversion element 200a and the photoelectric conversion element 200c can also be referred to as a distance between semiconductor regions (212a and 212c) of a first conductivity type. Further, the distance between the photoelectric conversion element 200a and the photoelectric conversion element 200b can also be referred to as a distance between semiconductor regions (212a and 212b) of a first conductivity type.

According to the present embodiment, the relation between depths of p-type semiconductor regions that can act as potential barriers against a signal charge is depth D4>D2>D1. Similarly to the second embodiment, the depth relation is arbitrary. Further, the same changes as in the second embodiment can be made for the p-type semiconductor region 514 of width W1 shown in FIG. 5B. Furthermore, a p-type semiconductor region that can act as a potential barrier against a signal charge may by configured by a plurality of semiconductor regions as in the modification example (FIGS. 6A and 6B) of the first embodiment.

Fourth Embodiment

Figure 7A:
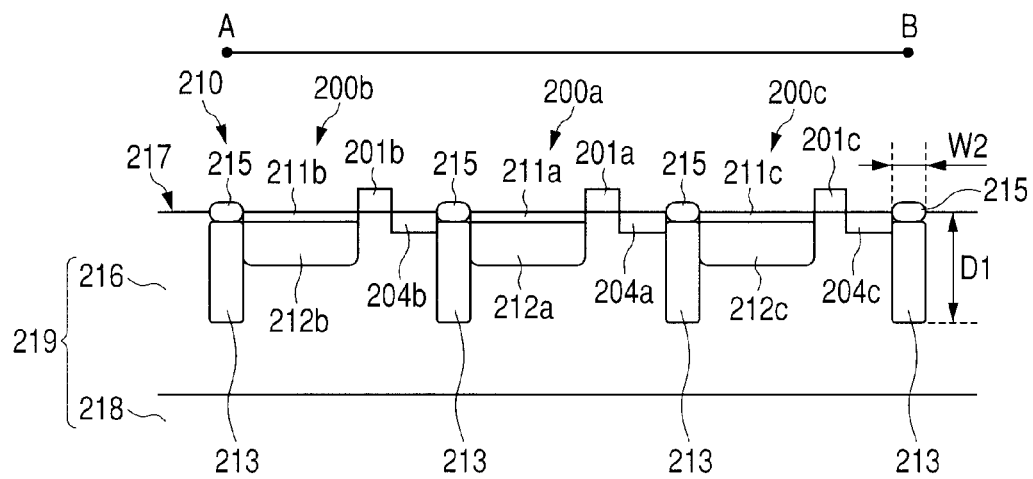
FIG. 7A and FIG. 7B are cross-sectional schematic views of a photoelectric conversion apparatus that describe a fourth embodiment.
Figure 7B:
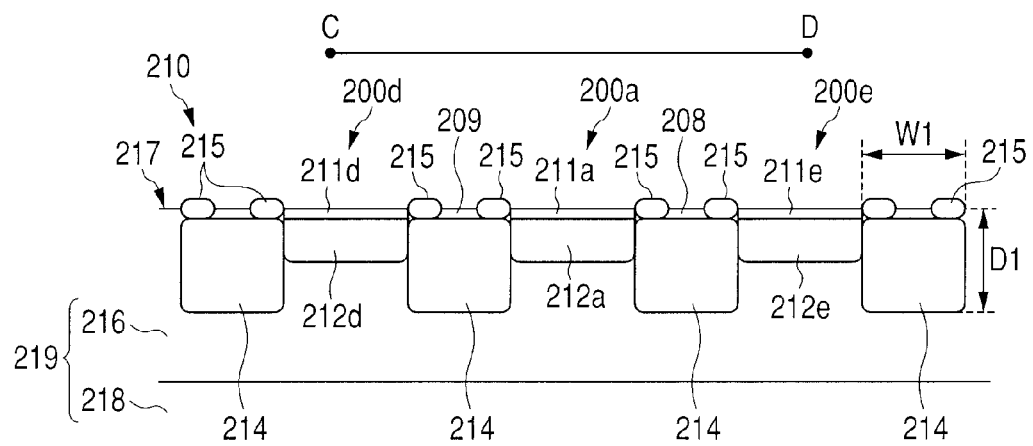

A photoelectric conversion apparatus of the present embodiment is described below using FIGS. 7A and 7B. According to the present embodiment, as a method of making potential barriers equal, the impurity concentrations of semiconductor regions forming the potential barriers are changed. Similarly to FIGS. 1A and 1B, FIGS. 7A and 7B are cross-sectional schematic views along the line AB and the line CD shown in FIG. 2B. The same structures corresponding as those in FIGS. 1A and 1B are denoted by the same reference numerals. And, detailed explanation of the same structures has been omitted.

In the photoelectric conversion apparatus shown in FIGS. 7A and 7B, the p-type semiconductor region 214 that has a width W1 and an impurity concentration C1 is arranged in the first isolation region of a width W1 between the photoelectric conversion element 200a and the photoelectric conversion element 200e. And the p-type semiconductor region 213 that has a width W2 and an impurity concentration C2 that is higher than the impurity concentration C1 is arranged in the second isolation region of a width W2 between the photoelectric conversion element 200a and the photoelectric conversion element 200c. The relation between the impurity concentrations is C2>C1. The depths of the p-type semiconductor regions 213 and 214 are the same (D1). By having p-type semiconductor regions with these width and impurity concentration relations, a variation between the potential barriers adjacent to the photoelectric conversion element 200 is reduced. And, it is possible to reduce a variation between the amounts of charges generated at the photoelectric conversion element 200 that mix into adjacent photoelectric conversion elements. The impurity concentrations C1 and C2 represent the peak concentration values of the semiconductor region 214 and the semiconductor region 213, respectively.

The p-type semiconductor regions 213 and 214 are formed by the following method. After forming an element isolation region on a semiconductor substrate, first, a first mask such as a photoresist that has an opening in a region in which the p-type semiconductor region 214 is to be formed on the semiconductor substrate is provided, and the p-type semiconductor region 214 is formed by performing ion implantation with a first dose amount. Thereafter, a second mask such as a photoresist that has an opening in a region in which the p-type semiconductor region 213 is to be formed on the semiconductor substrate is provided, and the p-type semiconductor region 213 is formed by performing ion implantation with a second dose amount. The ion implantations with the first and second dose amounts are performed by the same predetermined energies. Thus, p-type semiconductor regions that have different widths and impurity concentrations can be formed by separate processes. The order of forming the p-type semiconductor regions 213 and 214 is arbitrary. It is also possible to utilize a method in which, first, the p-type semiconductor regions 213 and 214 are formed in advance under the same conditions, and ion implantation is further performed thereafter on a portion forming the p-type semiconductor region 213 that has a higher impurity concentration.

As described in the present embodiment, when the widths of p-type semiconductor regions that can act as potential barriers against a signal charge are different, it is possible to equalize the movement of charges between photoelectric conversion elements by adjusting the impurity concentrations of the p-type semiconductor regions.

Figure 10A:
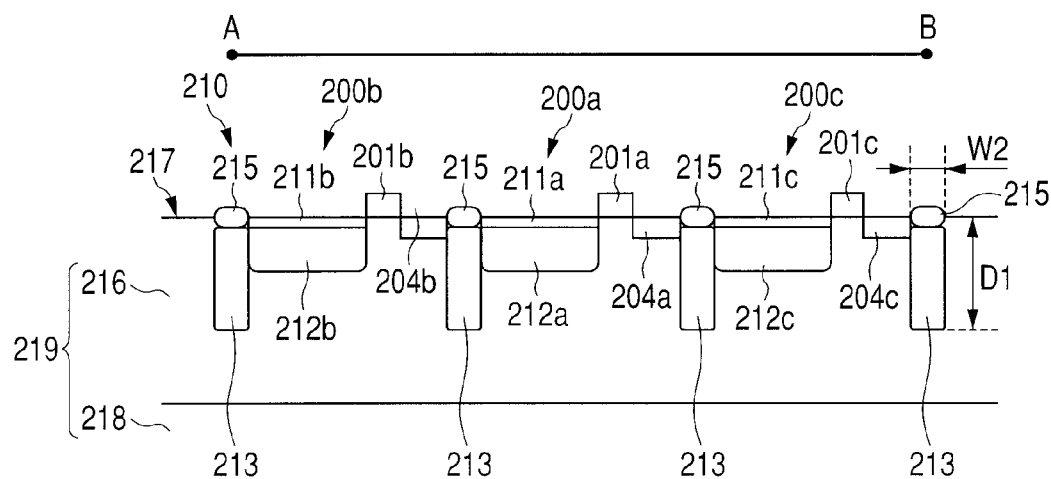
FIG. 10A and FIG. 10B are cross-sectional schematic views of a photoelectric conversion apparatus that describe a modification example of the fourth embodiment.
Figure 10B:
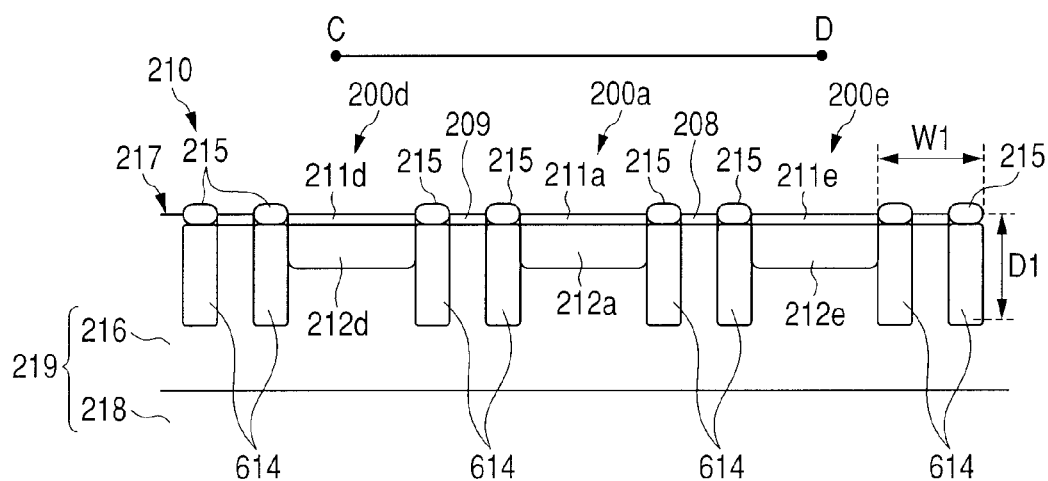

In the present embodiment the p-type semiconductor region 214 of width W1 is provided in a region of width W1 and the p-type semiconductor region 213 of width W2 is provided in a region of width W2. However, in the region of the width W1, the p-type semiconductor region 214 of a width different from the width W1 may be provided. For example, as illustrated in FIG. 10 which shows a similar cross-sectional schematic view to FIGS. 7A and 7B, a plurality of p-type semiconductor regions 614 of an arbitrary width that is different to the width W1 may be provided in the region of width W1.

Fifth Embodiment

Figure 8A:
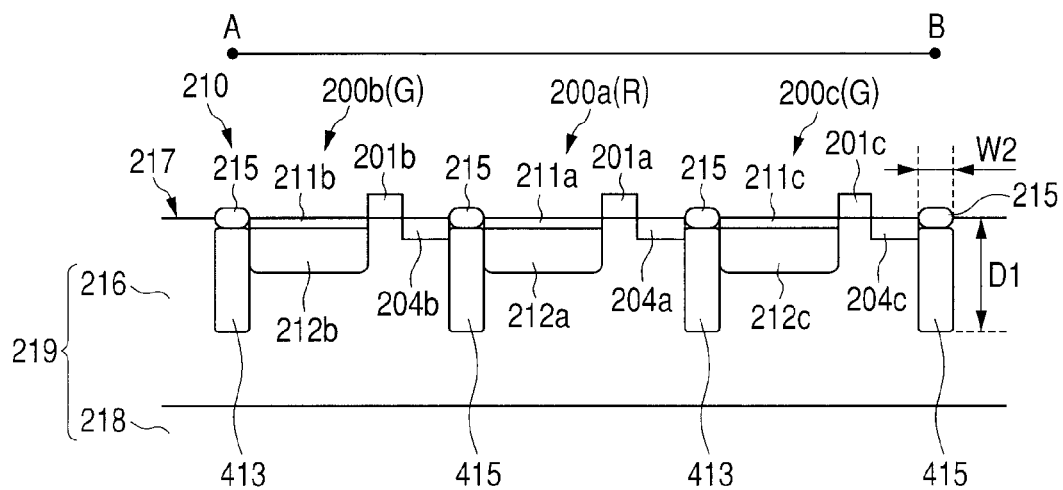
FIG. 8A and FIG. 8B are cross-sectional schematic views of a photoelectric conversion apparatus that describe a fifth embodiment.
Figure 8B:
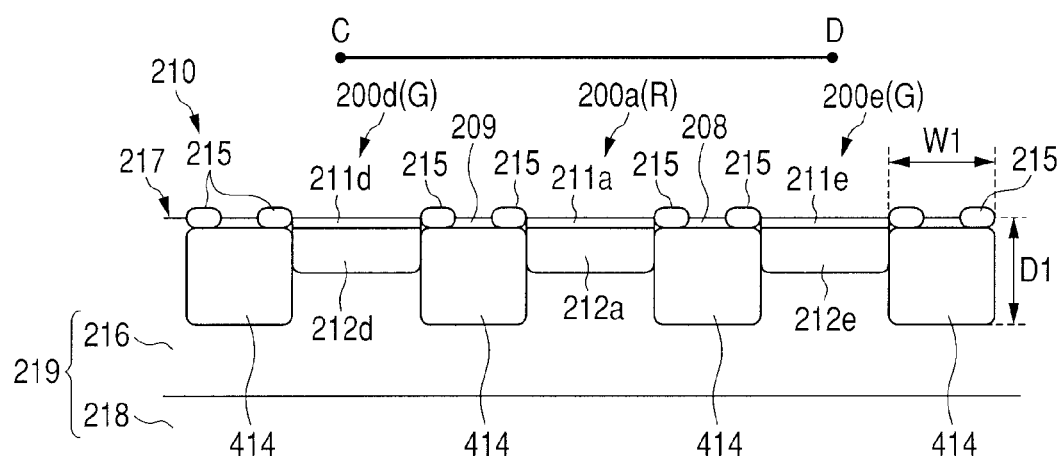

The present embodiment relates to a color photoelectric conversion apparatus. A feature of the present embodiment is that, in addition to the construction of the fourth embodiment, an impurity concentration of a p-type semiconductor region is adjusted according to a wavelength of incident light. The present embodiment is described specifically below using FIGS. 8A and 8B. FIGS. 8A and 8B are cross-sectional schematic views of a photoelectric conversion apparatus that corresponds to FIGS. 7A and 7B. Components illustrated in FIGS. 8A and 8B that have the same function as in FIGS. 7A and 7B are denoted by the same reference numbers, and a description of those components is omitted below.

The photoelectric conversion apparatus of the present embodiment includes a color filter. FIGS. 8A and 8B illustrate a case in which color filters are arranged according to the Bayer arrangement. For example, a red color filter (R) is provided on the upper part of the photoelectric conversion element 200a, and a green color filter (G) is provided on the upper part of the other photoelectric conversion elements 200b, 200c, 200d, and 200e. Hereunder, these components are denoted by 200a(R), 200b(G) and the like. In this case, light that is incident on the photoelectric conversion element 200a(R) reaches a deep part of the semiconductor substrate because the wavelength is long, and generates a charge in a deep part of the semiconductor substrate. Further, because a wavelength of light incident on the photoelectric conversion element 200b(G) is short in comparison to light incident on the photoelectric conversion element 200a(R), light incident on the photoelectric conversion element 200b(G) generates a charge at a shallow portion of the semiconductor substrate. Thus, according to the present embodiment, as shown in FIG. 8A, a p-type semiconductor region of width W2 includes a p-type semiconductor region 413 with an impurity concentration C2 and a p-type semiconductor region 415 with an impurity concentration C3 that is higher than the impurity concentration C2. The p-type semiconductor region 415 with the impurity concentration C3 is provided close to the photoelectric conversion element 200a(R). The p-type semiconductor region 413 with the impurity concentration C2 is provided closer to the photoelectric conversion element 200b(G) than to the photoelectric conversion element 200a(R). The situation regarding the p-type semiconductor region 414 of width W1 is the same as that of the p-type semiconductor region 214 of the fourth embodiment. According to this construction, even in a case in which wavelengths of incident light are different, it is possible to equalize the amounts of signal charges that mix into adjacent photoelectric conversion elements.

According to the present embodiment, the relation between impurity concentrations of p-type semiconductor regions that can act as potential barriers against a signal charge is C3>C2>C1. In this case, although the impurity concentration of the p-type semiconductor region 413 is taken as C2 that is the same as in the fourth embodiment, a construction may also be adopted in which the impurity concentration of the p-type semiconductor region 415 that has the higher impurity concentration is C2 and the impurity concentration of the p-type semiconductor region 413 is a value between C2 and C1. Further, with respect to the p-type semiconductor region 414 of width W1 shown in FIG. 8B also, the p-type semiconductor region need not only have the impurity concentration C1, and a p-type semiconductor region may be formed that has a higher impurity concentration than the impurity concentration C1 or that has a low impurity concentration in accordance with a wavelength of incident light. Furthermore, a p-type semiconductor region that can act as a potential barrier against a signal charge may by configured by a plurality of semiconductor regions as in the modification example (FIGS. 10A and 10B) of the fourth embodiment.

Sixth Embodiment

Figure 9A:
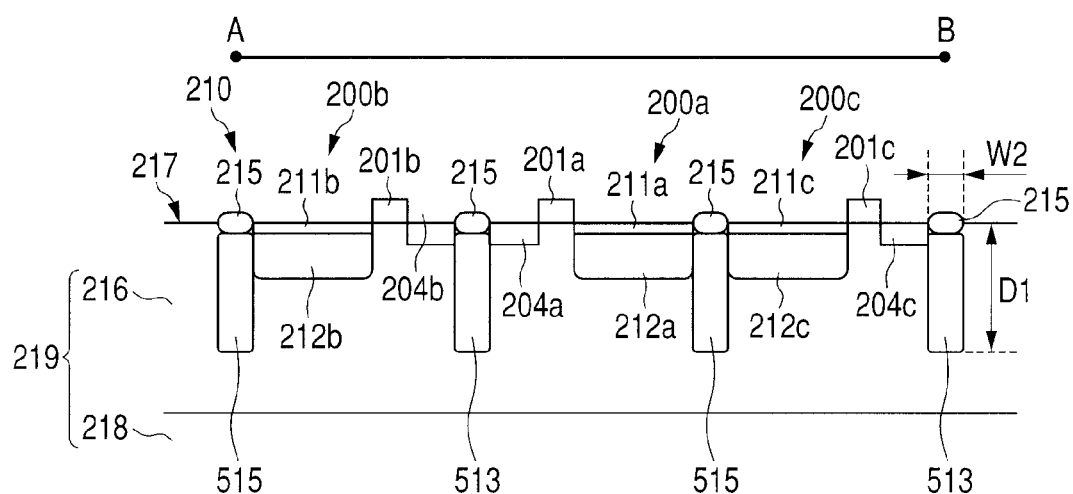
FIG. 9A and FIG. 9B are cross-sectional schematic views of a photoelectric conversion apparatus that describe a sixth embodiment.
Figure 9B:
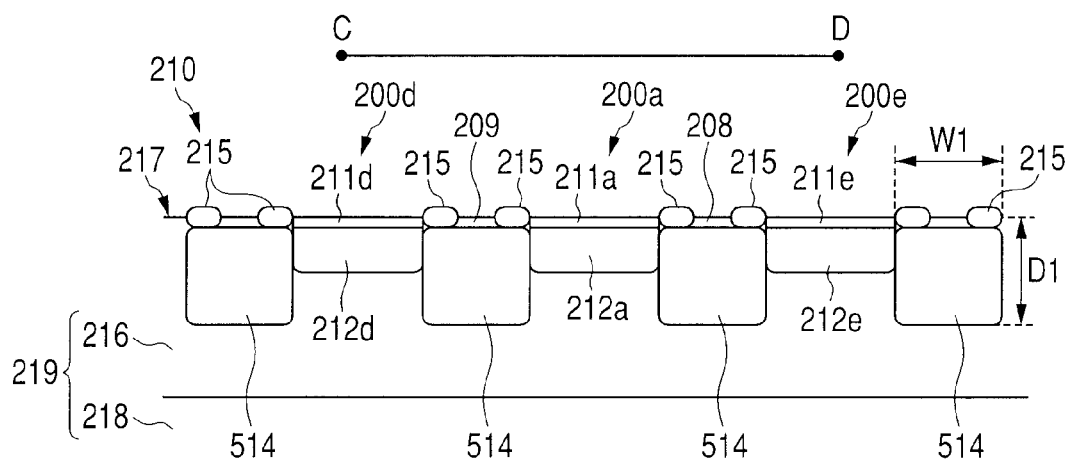

According to the present embodiment, a construction is described in which the layout of photoelectric conversion elements is different from the fourth embodiment. In the present embodiment, similarly to the fourth embodiment, impurity concentrations are changed according to widths of p-type semiconductor regions that can act as potential barriers against a signal charge. However, a feature of this embodiment is that the impurity concentrations of p-type semiconductor regions are adjusted according to the layout of photoelectric conversion elements. The present embodiment is described in detail using FIGS. 9A and 9B. FIGS. 9A and 9B are cross-sectional schematic views of a photoelectric conversion apparatus that is equivalent to that shown in FIGS. 7A and 7B. In FIGS. 9A and 9B, components that have the same functions as in FIGS. 7A and 7B are denoted by the same reference numbers and a description of those components is omitted below.

According to the present embodiment, the arrangement is a so-called mirror arrangement in which photoelectric conversion elements and the like are symmetric with respect to a certain criterion (in this case, the element isolation region 210) in a planar layout. More specifically, as shown in FIG. 9A, the photoelectric conversion element 200a and the photoelectric conversion element 200c are arranged so as to face each other in a condition in which the element isolation region 210 is sandwiched therebetween. Further, the floating diffusion region 204a and the floating diffusion region 204b are arranged so as to face each other in a condition in which the element isolation region 210 is sandwiched therebetween.

In this arrangement, a p-type semiconductor region of width W2 has a higher impurity concentration than a p-type semiconductor region 514 of width W1. Further, in this arrangement, a plurality of p-type semiconductor regions of width W2 include a p-type semiconductor region 513 that is at a large distance from the photoelectric conversion element 200a and a p-type semiconductor region 515 that is at a short distance from the photoelectric conversion element 200a. This is because a transfer transistor is arranged in an active region of the photoelectric conversion element. The impurity concentrations of the p-type semiconductor region 513 and the p-type semiconductor region 515 differ, respectively, according to a distance between a semiconductor region 212 of a first conductivity type of an adjacent photoelectric conversion element and the p-type semiconductor regions 513 and 515. More specifically, in FIG. 9A, the p-type semiconductor region 515 that is at a short distance from the photoelectric conversion element has an impurity concentration C4 that is higher than the impurity concentration C2 of the p-type semiconductor region 513 that is at a large distance from the photoelectric conversion element. When attention is focused on this configuration with respect to the distances between photoelectric conversion elements, the situation can also be described as follows. A distance between the photoelectric conversion element 200a and the photoelectric conversion element 200c is shorter than a distance between the photoelectric conversion element 200a and the photoelectric conversion element 200b. Hence, the p-type semiconductor region 515 with the impurity concentration C4 is provided between the photoelectric conversion element 200a and the photoelectric conversion element 200c, and the p-type semiconductor region 513 with the impurity concentration C2 that is lower than the impurity concentration C4 is provided between the photoelectric conversion element 200a and the photoelectric conversion element 200b. By adjusting the impurity concentrations of p-type semiconductor regions in this manner, it is possible to make the amount of a charge that mixes into the photoelectric conversion element 200c from the photoelectric conversion element 200a and the amount of a charge that mixes into the photoelectric conversion element 200b from the photoelectric conversion element 200a close to equal. In this connection, the distance between the photoelectric conversion element 200a and the photoelectric conversion element 200c can also be referred to as a distance between semiconductor regions (212a and 212c) of a first conductivity type. Further, the distance between the photoelectric conversion element 200a and the photoelectric conversion element 200b can also be referred to as a distance between semiconductor regions (212a and 212b) of a first conductivity type.

According to the present embodiment, the relation between impurity concentrations of p-type semiconductor regions that can act as potential barriers against a signal charge is impurity concentration C4>C2>C1. Similarly to the fifth embodiment, this impurity concentration relation is arbitrary. Further, the same changes as in the second embodiment can be applied to the p-type semiconductor region 514 of width W1 shown in FIG. 9B. Furthermore, a p-type semiconductor region that can act as a potential barrier against a signal charge may by configured by a plurality of semiconductor regions as in the modification example (FIGS. 10A and 10B) of the fourth embodiment.

Seventh Embodiment

Figure 11A:
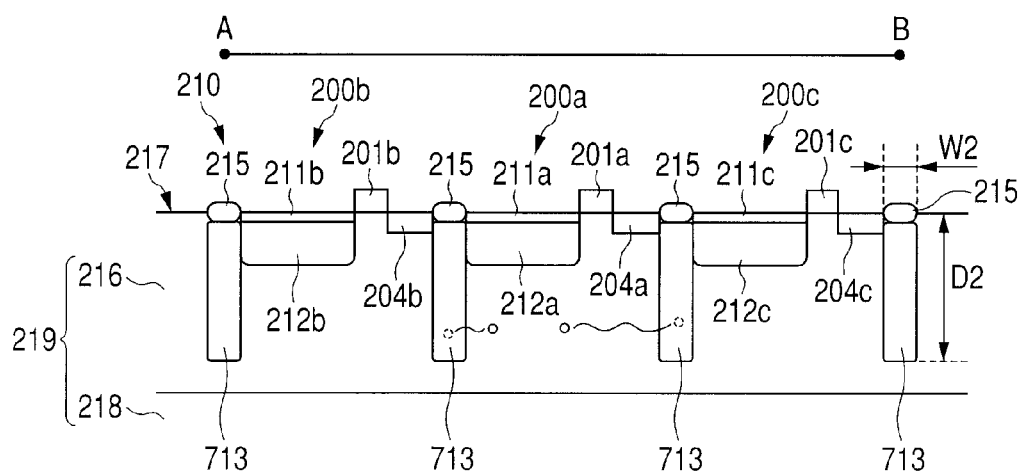
FIG. 11A and FIG. 11B are cross-sectional schematic views of a photoelectric conversion apparatus that describe a seventh embodiment.
Figure 11B:
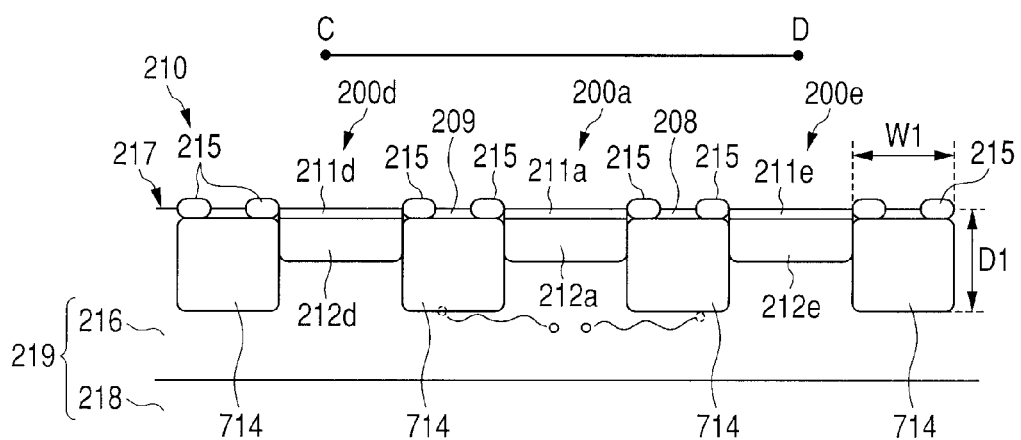

A photoelectric conversion apparatus of the present embodiment has a construction that combines the constructions of the first embodiment and the fourth embodiment. A feature of this embodiment is that the depth and concentration are changed according to the width of a p-type semiconductor region. The present embodiment is described specifically below using FIGS. 11A and 11B. FIGS. 11A and 11B are cross-sectional schematic views of a photoelectric conversion apparatus that corresponds to FIG. 1. Components illustrated in FIGS. 11A and 11B that have the same function as in FIGS. 1A and 1B are denoted by the same reference numbers, and a description of those components is omitted below.

Similarly to the first embodiment, the present embodiment includes a p-type semiconductor region 714 with a width W1 and a depth D1. The present embodiment also includes a p-type semiconductor region 713 with a width W2 and a depth D2. In this case, similarly to the fourth embodiment, the impurity concentration of the p-type semiconductor region 713 is an impurity concentration C2 that is higher than an impurity concentration C1 of the p-type semiconductor region 714. To make the impurity concentrations different, the ion implantation amounts of impurity ions can be changed when forming the p-type semiconductors of width W1 and width W2 by separate processes. By adopting this construction, it is possible to reduce variations in the amounts of signal charges that mix into adjacent photoelectric conversion elements by means of not only the depths of p-type semiconductor regions, but also the impurity concentrations thereof. That is, when the widths of p-type semiconductor regions are different, it is possible to reduce variations in the amounts of signal charges that mix into adjacent pixels by adjusting the depths and impurity concentrations of the p-type semiconductor regions.

(Application to Imaging System)

The present embodiment is described below in terms of a case of applying the photoelectric conversion apparatuses that have been described from the first embodiment to the seventh embodiment to an imaging system using FIG. 12. The term "imaging system" refers to a digital still camera, a digital video camera, or a digital camera for a mobile phone.

Figure 12:
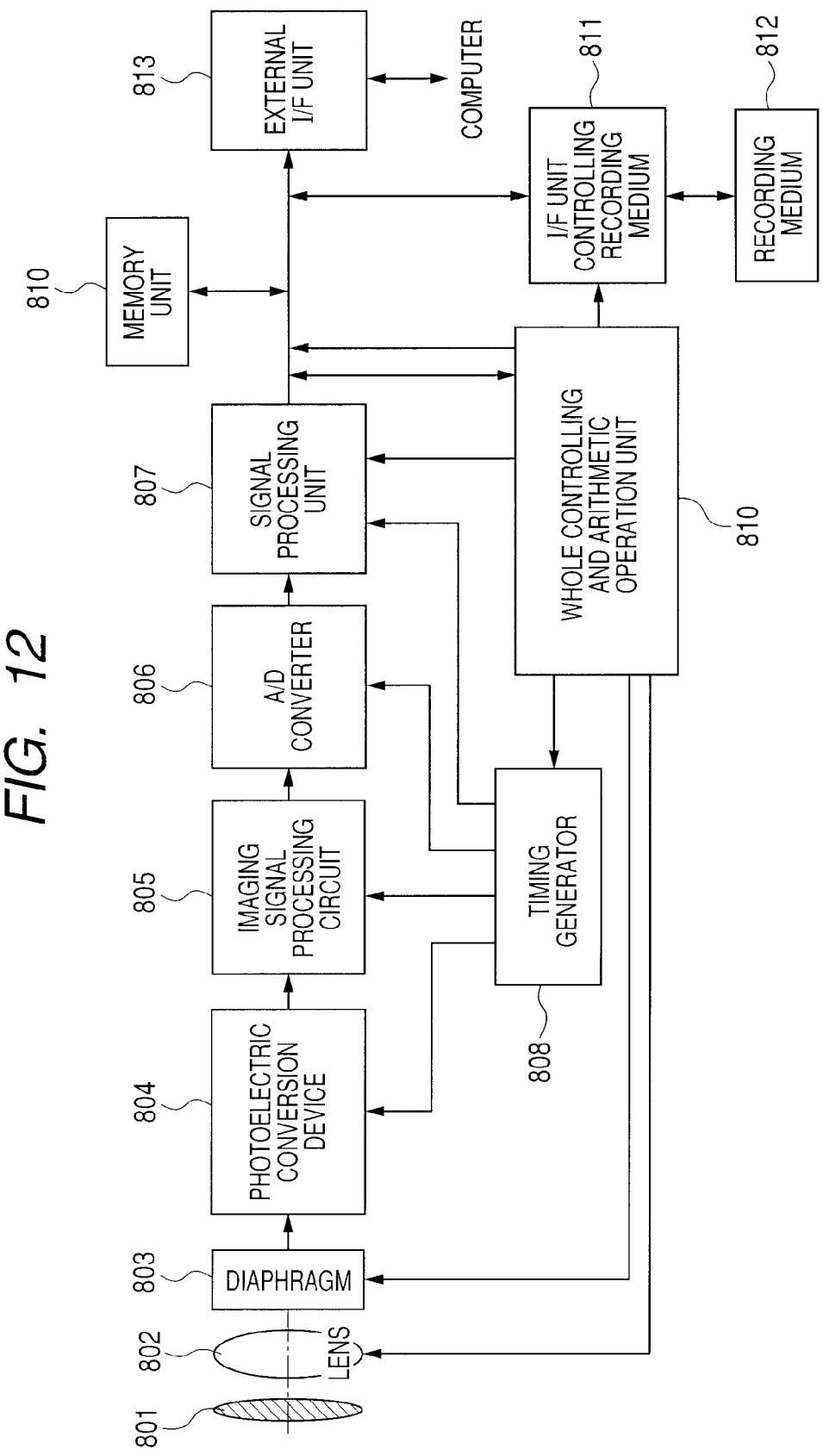
FIG. 12 is a block diagram that describes an imaging system.

FIG. 12 is a diagram illustrating the configuration of a digital still camera. An optical image of a subject is formed on an imaging plane in a photoelectric conversion apparatus 804 by an optical system including a lens 802. Outside the lens 802, a barrier 801, which provides a protection function for the lens 802 and also serves as a main switch may be provided. The lens 802 may be provided with a diaphragm 803 for adjusting the amount of light emitted from the lens 802. Imaging signals output from the photoelectric conversion apparatus 804 via a plurality of channels are subjected to processing such as various corrections and clamping, by means of an imaging signal processing circuit 805. Analog-digital conversion of the imaging signals output from the imaging signal processing circuit 805 via the plurality of channels is performed by means of an A/D converter 806. The image data output from the A/D converter 806 is subjected to various corrections, data compression and the like by a signal processing unit (image processing unit) 807. The photoelectric conversion apparatus 804, the imaging signal processing circuit 805, the A/D converter 806 and the signal processing unit 807 operate according to a timing signal generated by a timing generator 808. Each block is controlled by a whole controlling and arithmetic operation unit 809. The digital still camera further includes a memory unit 810 for temporarily storing image data, and an I/F unit controlling recording medium 811 for recording or reading images to or from a recording medium. A recording medium 812 includes a semiconductor memory or the like, and is detachable from the digital still camera. The digital still camera may further include an external interface (I/F) unit 813 for communication with an external computer or the like. The imaging signal processing circuit 805, the A/D converter 806, the signal processing unit 807, and the timing generator 808 may be formed on the same chip as the photoelectric conversion apparatus 804.

Next, operations of the components shown in FIG. 12 are described. In response to the barrier 801 being opened, the main power, power for a control system, and power for imaging system circuits such as the A/D converter 806 are sequentially turned on. Subsequently, in order to control the exposure amount, the whole controlling and arithmetic operation unit 809 causes the diaphragm 803 to open. Signals output from the photoelectric conversion apparatus 804 pass through the imaging signal processing circuit 805 and are provided to the A/D converter 806. The A/D converter 806 performs A/D conversion of the signals and outputs the converted signals to the signal processing unit 807. The signal processing unit 807 processes the data and provides the data to the whole controlling and arithmetic operation unit 809. The whole controlling and arithmetic operation unit 809 performs an arithmetic operation to determine the exposure amount. The whole controlling and arithmetic operation unit 809 controls the diaphragm based on the determined exposure amount. Next, the whole controlling and arithmetic operation unit 809 extracts high-frequency components from the signals that have been output from the photoelectric conversion apparatus 804 and then processed by the signal processing unit 807, and performs an arithmetic operation to determine the distance to the subject based on the high-frequency components. Thereafter, the lens 802 is driven and it is determined whether or not the camera is in focus. If it is determined that the camera is not in focus, the lens 802 is driven again and an arithmetic operation to determine the distance is performed once more. After confirming that the camera is in focus, exposure starts. When the exposure ends, the imaging signals output from the photoelectric conversion apparatus 804 are subjected to correction and the like at the imaging signal processing circuit 805, undergo A/D conversion at the A/D converter 806, and are processed at the signal processing unit 807. The image data processed at the signal processing unit 807 is accumulated in the memory unit 810 by the whole controlling and arithmetic operation unit 809. Thereafter, the image data accumulated in the memory unit 810 is recorded in the recording medium 812 via the I/F unit controlling recording medium by control of the whole controlling and arithmetic operation unit 809. The image data is also provided to a computer or the like via the external I/F unit 813 and processed.

As described above, a photoelectric conversion apparatus according to the present invention is applied to an imaging system. As a result of using the photoelectric conversion apparatus according to the present invention, mixing (cross talk) quantities of signal charges between pixels are equalized, and thus image processing at a signal processing circuit is facilitated in comparison to a case in which charges mix non-uniformly. Hence, it is possible to simplify the construction of a signal processing unit of an imaging system or the like.

In the above described embodiments, structures wherein a depth or impurity concentration of the p-type semiconductor region is adjusted are described as examples. Intended in the present invention is to reduce or remove the difference between the potential barriers formed by the first and second semiconductor regions. That is to equalize impurity concentrations to form the p-type regions in the first and second element isolation regions. To meet the intention, another modification may be made without deviation from a spirit and scope of the present invention.

Several exemplary embodiments of the present invention have been described above. However, the present invention is not limited to the exemplary embodiments, and appropriate modifications thereof are possible. For example, the arrangement of semiconductor regions is not limited to the arrangement described above, and the regions may be divided into a plurality of regions or may be integrated into a single region. Each of the first and second semiconductor regions may comprises a plurality of semiconductor regions formed by plural times of impurity implantation. The polarities of the charges, the semiconductor regions and the transistors may also be changed appropriately. It is also not necessary for the pixel array to be a matrix shape, and the configuration is not limited to a layout in which photoelectric conversion elements are offset in columns at a predetermined distance for each column. Further, the constructions of the exemplary embodiments can be appropriately combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-055209, filed Mar. 9, 2009, Japanese Patent Application No. 2009-055210, filed Mar. 9, 2009, and Japanese Patent Application No. 2010-027917, filed Feb. 10, 2010 which are hereby incorporated by reference herein in their entirety.

What is claimed is:

1. A photoelectric conversion apparatus comprising:
a semiconductor substrate;
a plurality of photoelectric conversion elements arranged on the semiconductor substrate, and including a first photoelectric conversion element, a second photoelectric conversion element adjacent to the first photoelectric conversion element, and a third photoelectric conversion element adjacent to the first photoelectric conversion element;
a plurality of transistors arranged on the semiconductor substrate, for transferring a signal charge generated in the photoelectric conversion elements;
a first semiconductor region of a first conductivity type, such that the signal charge is a minor carrier, arranged between the first photoelectric conversion element and the second photoelectric conversion element, wherein the first semiconductor region has a first width; and
a second semiconductor region of the first conductivity type is arranged between the first photoelectric conversion element and the third photoelectric conversion element, wherein the second semiconductor region has a second width smaller than the first width, and wherein
the first and second semiconductor regions extend from a predetermined position in the semiconductor substrate in a direction of a depth of the semiconductor substrate, and
the second semiconductor region extends, from the predetermined position, into the semiconductor substrate, deeper than the first semiconductor region.

2. The photoelectric conversion apparatus according to claim 1, wherein
the second semiconductor region has an impurity concentration higher than that of the first semiconductor region.

3. The photoelectric conversion apparatus according to claim 1, further comprising
a plurality of color filters arranged over the photoelectric conversion elements.

4. The photoelectric conversion apparatus according to claim 3, wherein
the color filters include red, blue and green color filters,
a plurality of the second semiconductor regions are provided, and
one or more of the plurality of the second semiconductor regions are arranged adjacent to the photoelectric conversion element over which the red color filter is arranged, and
extend deeper in the semiconductor substrate, or has higher impurity concentration, than another of the plurality of second semiconductor regions.

5. The photoelectric conversion apparatus according to claim 1, wherein
the first semiconductor region is formed by a plurality of ion implantations of different energies, and the second semiconductor region is formed by a plurality of ion implantations of different energies.

6. The photoelectric conversion apparatus according to claim 1, wherein
the first and second semiconductor regions operate as a potential barrier against the signal charge, and the potential barriers formed by the first and second semiconductor regions are the same.

7. The photoelectric conversion apparatus according to claim 1, further comprising
an element isolation structure including an insulator arranged at a surface of the semiconductor substrate over the first or second semiconductor region.

8. The photoelectric conversion apparatus according to claim 1, wherein the photoelectric conversion apparatus is incorporated into an imaging system that includes
a signal processing unit for processing a signal outputted from the photoelectric conversion apparatus.

9. The photoelectric conversion apparatus according to claim 1, wherein
the plurality of photoelectric conversion elements are arranged two-dimensionally, the first photoelectric conversion element and the second photoelectric conversion element are arranged along a first direction, and the first photoelectric conversion element and the third photoelectric conversion element are arranged along a second direction, such that the first direction crosses the second direction perpendicularly.

10. The photoelectric conversion apparatus according to claim 1, wherein
the first and second semiconductor regions contact each other and have a grid shape.

11. A photoelectric conversion apparatus comprising:
a semiconductor substrate;
a plurality of photoelectric conversion elements arranged on a main surface of the semiconductor substrate, and including a first photoelectric conversion element, a second photoelectric conversion element arranged adjacent to the first photoelectric conversion element, and a third photoelectric conversion element arranged adjacent to the first photoelectric conversion element;
a plurality of transistors arranged on the semiconductor substrate, for transferring a signal charge generated in the photoelectric conversion elements;

a first semiconductor region of a first conductivity type, such that the signal charge is a minor carrier, arranged between the first photoelectric conversion element and the second photoelectric conversion element, wherein the first semiconductor region has a first width; and a second semiconductor region of the first conductivity type arranged between the first photoelectric conversion element and the third photoelectric conversion element, wherein the second semiconductor region has a second width smaller than the first width, and wherein the first and second semiconductor regions extend from a predetermined position in the semiconductor substrate in a direction of a depth of the semiconductor substrate, and the second semiconductor region has an impurity concentration higher than that of the first semiconductor region.

12. The photoelectric conversion apparatus according to claim 11, further comprising a plurality of color filters arranged over the photoelectric conversion elements.

13. The photoelectric conversion apparatus according to claim 12, wherein the color filters include red, blue and green color filters, a plurality of the second semiconductor regions are provided, one or more of the plurality of the second semiconductor regions are arranged adjacent to the photoelectric conversion element over which the red color filter is arranged, and extend deeper in the semiconductor substrate, or has higher impurity concentration, rather than another of the plurality of second semiconductor regions.

14. The photoelectric conversion apparatus according to claim 11, wherein the first semiconductor region is formed by a plurality of ion implantations of different energies, and the second semiconductor region is formed by a plurality of ion implantations of different energies.

15. The photoelectric conversion apparatus according to claim 11, wherein the first and second semiconductor regions operate as a potential barrier against the signal charge, and the potential barriers formed by the first and second semiconductor regions are the same.

16. The photoelectric conversion apparatus according to claim 11, further comprising an element isolation structure including an insulator arranged at a surface of the semiconductor substrate over the first or second semiconductor region.

17. The photoelectric conversion apparatus according to claim 11, wherein the photoelectric conversion apparatus is incorporated into an imaging system that includes a signal processing unit for processing a signal outputted from the photoelectric conversion apparatus.

18. The photoelectric conversion apparatus according to claim 11, wherein the plurality of photoelectric conversion elements are arranged two-dimensionally, the first photoelectric conversion element and the second photoelectric conversion element are arranged along a first direction, and the first photoelectric conversion element and the third photoelectric conversion element are arranged along a second direction, such that the first direction crosses the second direction perpendicularly.

19. The photoelectric conversion apparatus according to claim 11, wherein the first and second semiconductor regions contact each other and have a grid shape.

* * * * *